United States Patent [19]

Jenkins

[11] 4,166,984

[45] Sep. 4, 1979

[54] RESTRICTED RATE OF CHANGE PHASE LOCK LOOP APPARATUS

[75] Inventor: James R. Jenkins, Fort Worth, Tex.

[73] Assignee: Rockwell International Corporation, El Segundo, Calif.

[21] Appl. No.: 909,737

[22] Filed: May 25, 1978

[51] Int. Cl.² .............................................. H03B 3/04
[52] U.S. Cl. ...................................... 331/1 A; 331/17; 331/25; 331/27; 331/158; 331/177 V
[58] Field of Search ...................... 331/1 A, 14, 17, 25, 331/27; 329/50, 122

[56] References Cited

U.S. PATENT DOCUMENTS 3,939,438  2/1976  Taylor ..................................... 331/14
4,074,207  2/1978  Forsberg ............................. 331/1 A

*Primary Examiner*—Siegfried H. Grimm
*Attorney, Agent, or Firm*—Bruce C. Lutz; Howard R. Greenberg; H. Fredrick Hamann

[57] ABSTRACT

A phase lock loop is illustrated which includes clamp means for controlling the rate of change of the output phase to no more than a preselected value. This feature has been found to be beneficial in certain applications such as temporary restraint of the dynamics of a phase lock loop of a data alignment unit of a communications system where downstream equipment cannot tolerate more than a predetermined phase change per unit time without losing synchronization.

6 Claims, 6 Drawing Figures

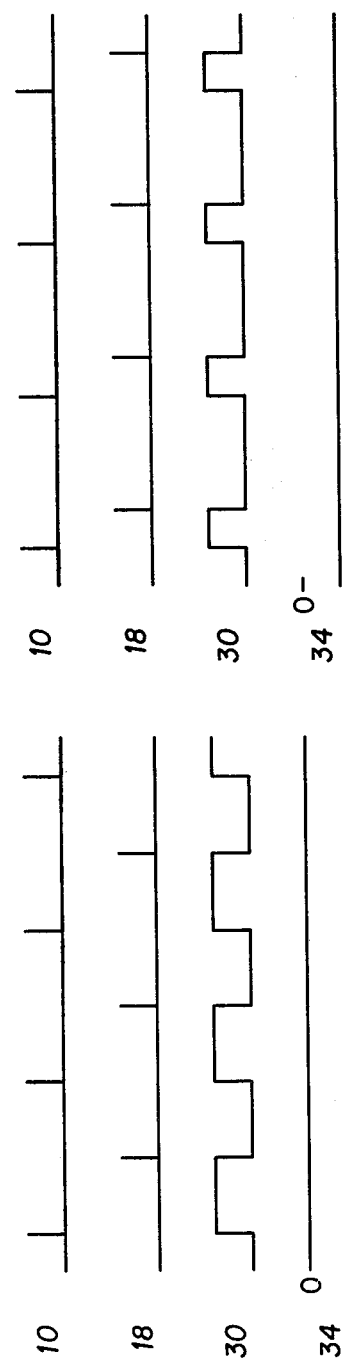
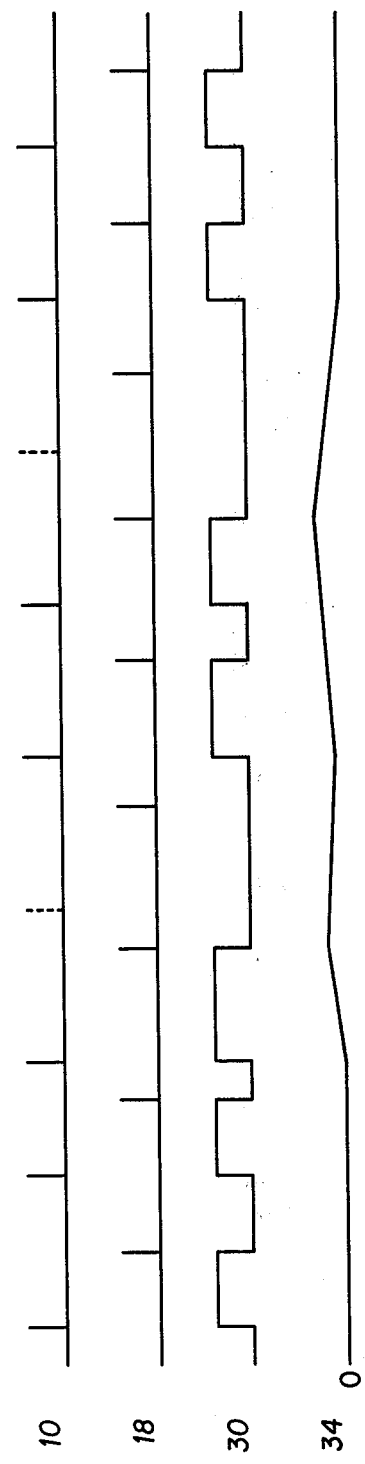

RESTRICTED RATE OF CHANGE PHASE LOCK LOOP APPARATUS

THE INVENTION

The present invention is directed generally to electronics and, more specifically, to a phase lock loop. Even more specifically, the present invention is directed to a phase lock loop having, upon command, a predetermined maximum rate of phase change at the output with a step change input.

In communication systems, it is desirable to have spare components and subsystems for substitution in place of failing or failed units. In some applications of communication equipment, all channels will not be operating at the same phase due to different path lengths created by space diversity, frequency diversity and other signal transmission impediments. Accordingly, if receiving equipment is to continue receiving signals without loss of synchronization, it is necessary that the rate of change of phase of any signals be within the tracking capability of the receiving equipment.

The present phase lock loop is designed for use, among other applications, in a microwave link wherein the phase of the output is slowly adjusted to a desired value (maximum instantaneous frequency offset) after switching between operative channels.

It is, thus, an object of the present invention to provide an improved phase lock loop having a controlled rate of change of output signal phase or, in art terms, "controlled slew rate".

Other objects and advantages of the present invention will be ascertained from a reading of the specification and appended claims in conjunction with the drawings wherein:

FIGS. 3a, 3b and 4 are sets of drawings used in describing the operation of FIGS. 1 and 2.

DETAILED DESCRIPTION

Figure 1:
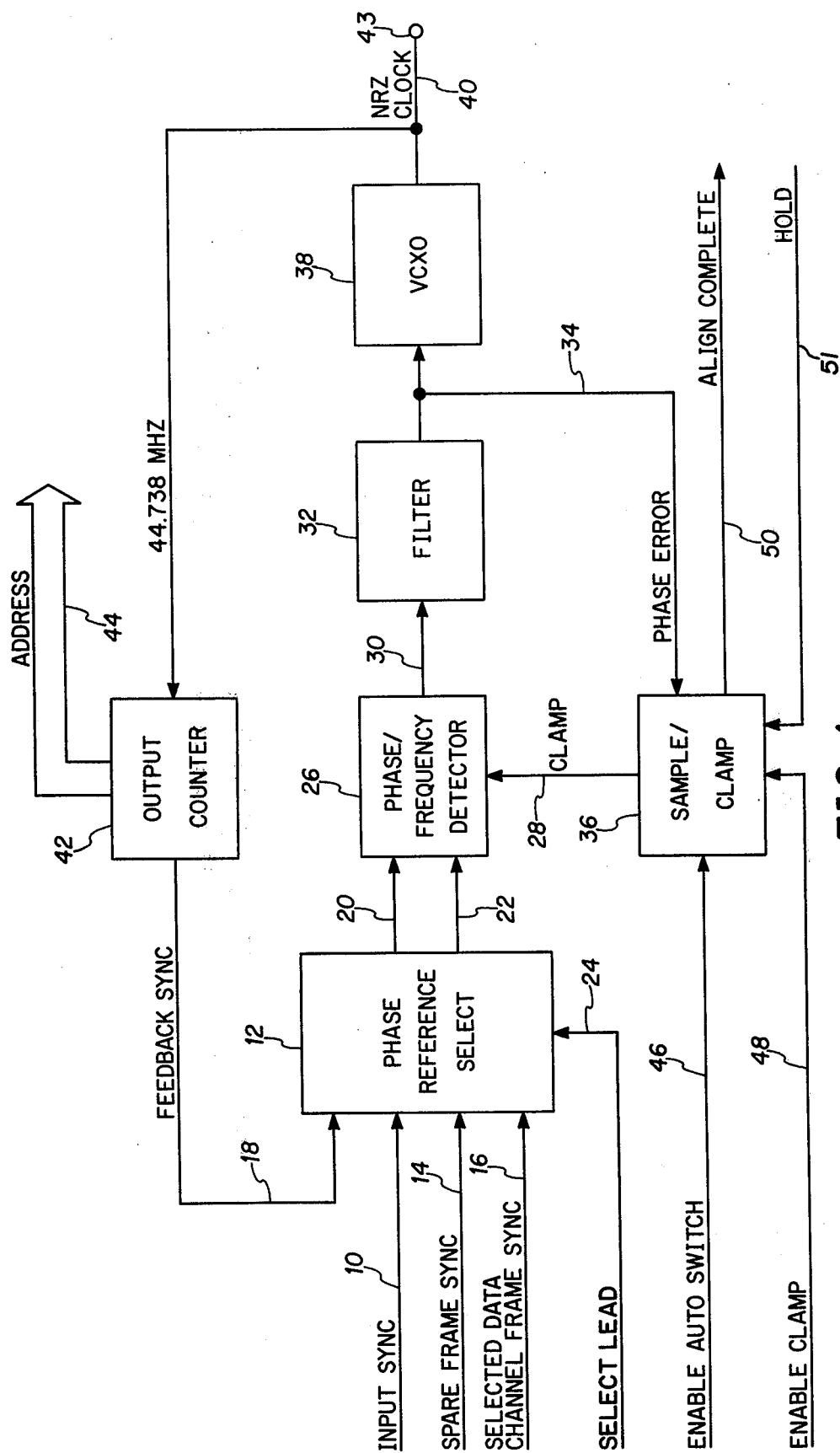
FIG. 1 is a block diagram of a preferred embodiment of the invention.

A lead 10 supplies input synchronization (sync) signals to a Phase Reference Select block 12. Block 12 also receives a spare frame sync signal on lead 14 and a selected data channel frame sync signal on lead 16. A feedback sync signal appears on lead 18 and is also applied to the input of Phase Reference Select block 12. Phase Reference Select block 12 has two output leads 20 and 22. A set of switches within select block 12 are controlled by signals on a select lead 24 which, in a first condition, supplies signals from leads 10 and 18 to output leads 20 and 22 and, in a second condition, supplies the signals from leads 14 and 16 to output leads 20 and 22. The leads 20 and 22 are supplied to a Phase Detector block 26 which has a Clamp Signal Input lead 28 and an output lead 30. Lead 30 connects phase detector 26 to a filter 32, which outputs a phase error signal on lead 34 and supplies signals to a sample/clamp circuit 36, as well as to a voltage controlled crystal oscillator (VCXO) 38. A Clock Signal lead 40 appears at the output of block 38 and supplies (in a preferred embodiment of the invention) nonreturn to zero (NRZ) 44.738 MHz signals, to an output counter 42 as well as to an output terminal 43. Output counter 42 has a plurality of address output leads designated as 44, as well as the feedback sync lead 18. The Sample/Clamp block 36 receives enable auto switch signals on a lead 46, sample or clamp signals enable on a lead 48, outputs an alignment complete signal on a lead 50 and receives a hold signal on a lead 51.

The leads 14, 16, 50 and 48, are not actively used in the present inventive concept, but are shown for completeness of disclosing a preferred embodiment.

Figure 2A:
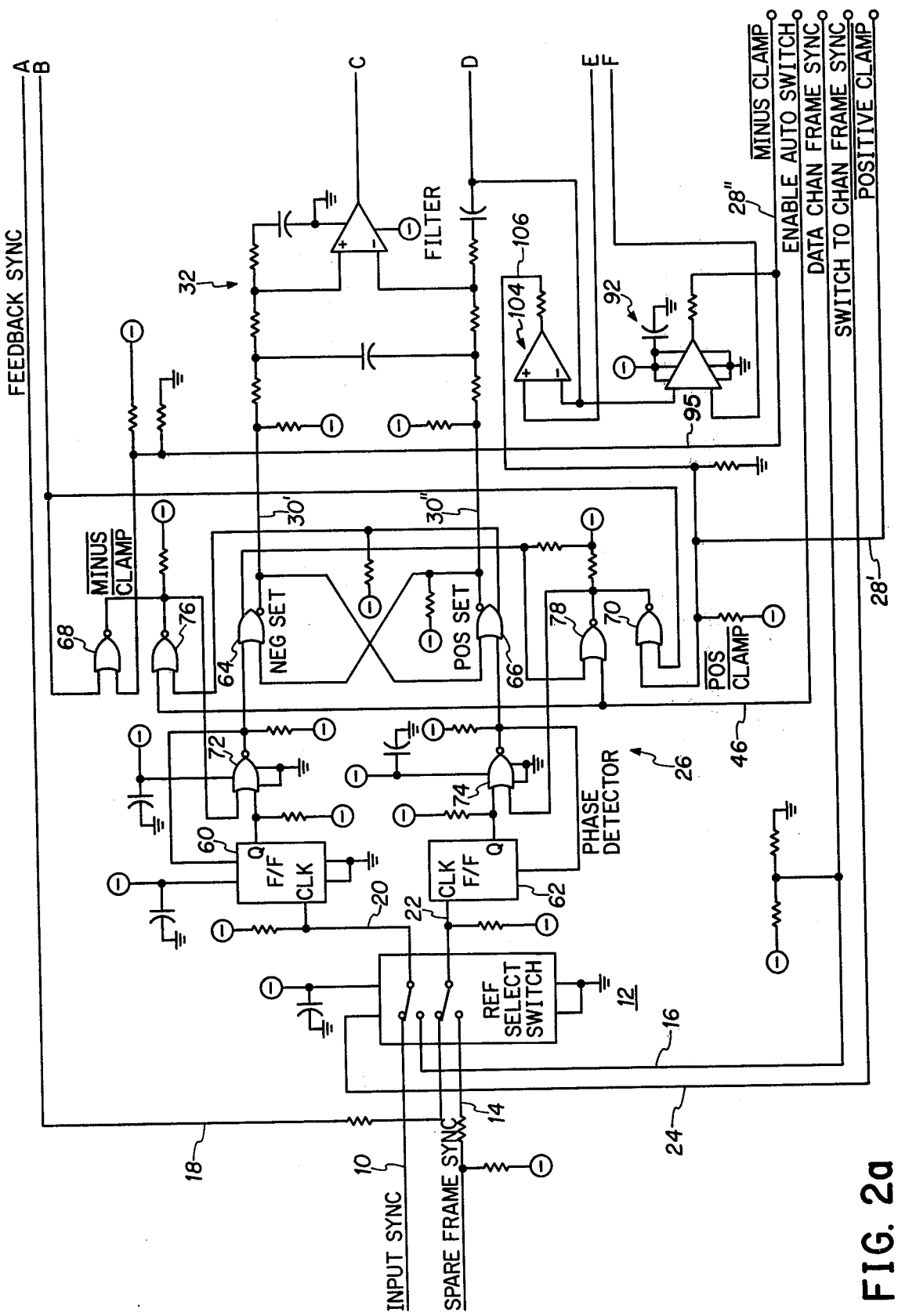
FIGS. 2a and 2b are a detailed schematic diagram of the blocks of FIG. 1.
Figure 2B:
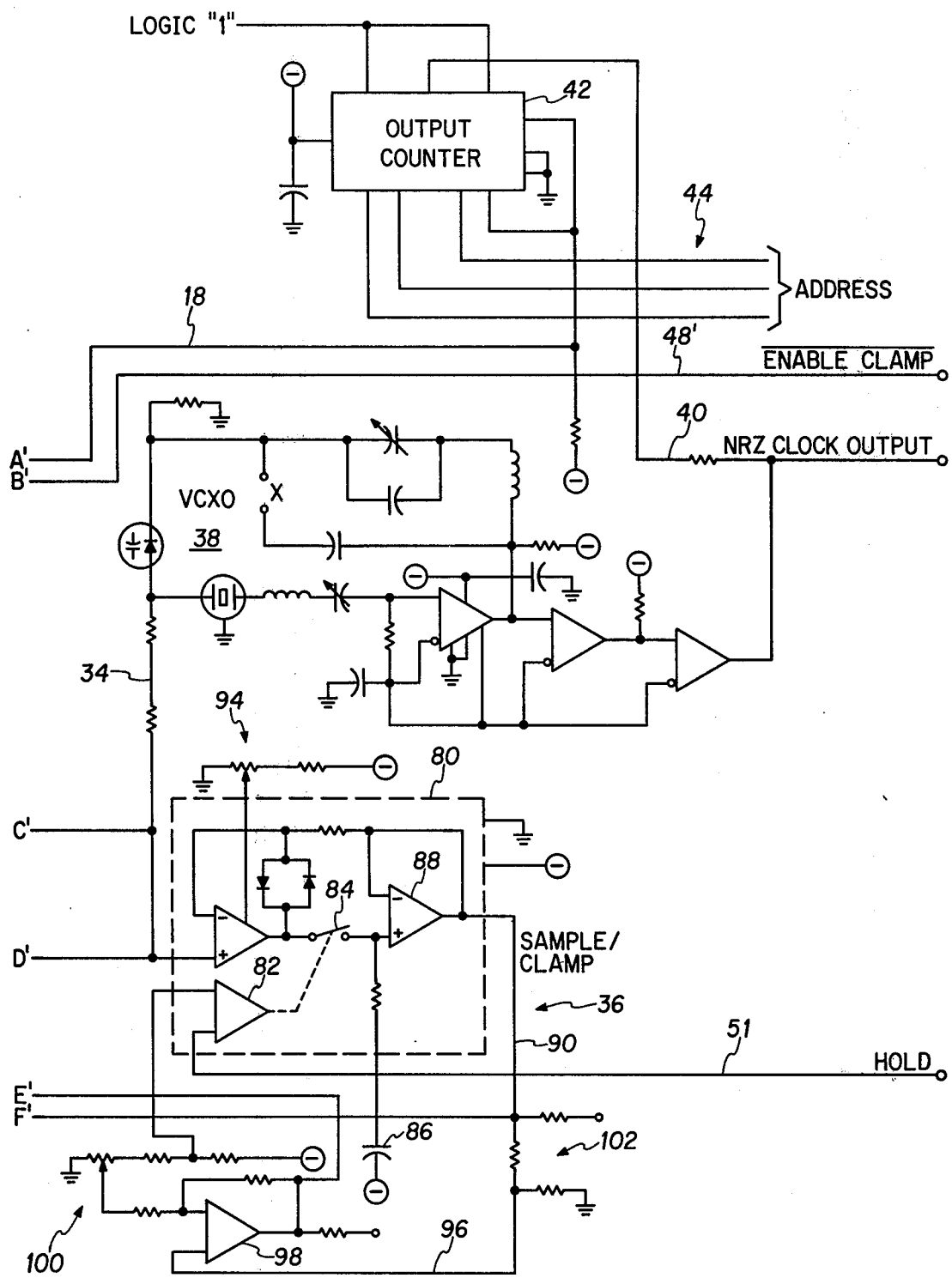

In FIGS. 2a and 2b the same numbers are used as shown in FIG. 1 to designate identical items. The same number with a ' or " is used to designate similar (not identical) lines such as 48' which is used to indicate an enable clamp rather than the enable clamp of FIG. 1. A further example is lines 28' and 28" which are the positive and minus clamp leads whereas in FIG. 1 there is only a single clamp lead shown. It should also be noted that the inputs to the reference select 12 of FIG. 2 are not shown in the same order as illustrated in FIG. 1 since the ECL 10,000 series chip 10158 used to practice the invention had the inputs illustrated as shown. For simplicity of description, the internal operation of this chip has been shown as two switches which are operated via signals input on lead 24. These are output to two blocks 60 and 62 which are both D type flip-flops. Signals from these two flip-flops are used to activate a further flip-flop comprising a pair of OR/NOR gates 64 and 66. As will be ascertained, signals from the flip-flops 60 and 62 are normally used to periodically activate in alternate sequence the OR/NOR gates 64 and 66. However, when appropriate signals are applied to further NOR gates 68 and 70, one of a pair of intermediate NOR gates 72 and 74 are deactivated so that although the flip-flops 60 and 62 continue changing in output state, the signals are not passed through to the flip-flop at the output of the phase detector 26, comprising OR/NOR gates 64 and 66. A final set of NOR gates 76 and 78 are also included for control functions to be later described. Signals are output on the pair of leads 30 (30' and 30") to the filter 32 and are applied to the oscillator 38 as well as to an input of a sample and hold block 80 within sample/clamp circuit 36. Block 80 may be an LF-398 sample and hold circuit. Such an integrated circuit chip may be obtained from the National Semiconductor Corporation. Within block 80, a comparison amplifier 82 operates a switch designated as 84 in response to a hold signal on lead 51 to pass an incoming signal received on lead 34 to a capacitor 86. After the sampling period, switch 84 opens and the signal appearing on capacitor 86 is held by a comparator amplifier 88 to be used in the clamping function. Signals from amplifier 88 are output on a lead 90 to a comparator stage 92. The signals on lead 90 represent a summation of a negative offset as obtained from a negative offset circuit 94 and the input signal on lead 34. This signal is compared with the signal on lead 34 by circuit 92 and a logic "0" output is provided on a lead 95 to the negative or minus clamp NOR gate 68 when the signal on lead 34 exceeds a predetermined value in the negative direction. The signals on lead 90 are also passed via a lead 96 to another amplifier circuit 98 which receives signals from a positive offset circuit 100. Through the combination of a pair of resistors 102 and the positive offset circuit 100, the negative offset is removed from the signal on lead 90 and a positive offset is introduced so that a comparison can be made in a further comparator circuit 104 between the signal received on lead 34 and a signal received from comparator 98 whereby a logic "0" signal is provided on a lead 106 to the positive clamp NOR gate 70 whenever the sgnals on lead 34 exceed a predetermined value in the positive direction.

A block shown as 42, which is the output counter, may be an ECL 10136 integrated circuit chip. This chip is programmed such that for every eighth input bit, an output is obtained on the feedback sync line 18 for use in phase detector operations. The other three leads illustrated as 44 provide a coded count as an address to other circuitry.

FIGS. 3a, 3b and 4 illustrate waveforms representing signals found on leads having the same numbers as used to designate the waveforms in these two figures. In FIG. 3a, waveform 10 illustrates the signals found under given conditions on input sync line 10. If the signals on feedback sync line 18 are as shown, the circuit is locked in the desired relationship since the output on 34 is zero, as evidenced by the symmetrical waveform 30. In FIG. 3b, the pulses on line 18 are not exactly intermediate the pulses on line 10, thereby operating the flip-flop in the output stage of phase detector 26 such that nonsymmetrical waveform 30 is obtained and an output is illustrated on line 34 after being filtered to obtain a given negative value with respect to zero or ground potential.

The same comments apply to FIG. 4 wherein the output is limited by the clamp circuit 36 so as to prevent the output on 34 from reaching more than a predetermined value. While for FIGS. 3a, 3b and 4, very narrow pulses have been shown for the signals appearing on lines 10 and 18, in actuality, one or both of these signals may be square wave or other pulse signals and, thus, the lines merely represent the positive going or leading edge side of the signals provided.

OPERATION

The upper portion of FIG. 1 operates very much like any other phase or frequency lock loop system. In other words, the phase detector 26 checks the difference in phase between the two input signals appearing on leads 20 and 22 and provides an output on lead 30 which is a square wave. The filter 32 filters or averages this square wave and provides an output on lead 34 which is indicative of the nonsymmetry of the square wave received and the phase error. This signal on lead 34 adjusts the frequency of oscillator 38 to provide an output which is passed through output counter 42 back through lead 18 and lead 20 to the input of phase detector 26. It should be mentioned here that most phase detectors and, specifically, the one illustrated herein, provides outputs indicative of both phase and frequency differences. Therefore, I use the word phase or signal characteristic detector to include not only phase detectors, per se, but combination phase and frequency detectors such as used in the specific embodiment for this invention. As previously indicated, the select circuit 12 merely chooses between the two leads 10 and 18 and the two leads 14 and 16 to provide the phase locking action. The counter 42 provides not only a coded output on the set of leads 44, but acts as a ÷ by 8 circuit to reduce the frequency of the signal coming in on lead 40 to that going out on lead 18. When a signal is received on the enable clamp lead 48, the magnitude of the signal on lead 34 is sampled. If it is greater than a given amount, thereby indicating a larger than desirable slew rate (too fast a loop response), an output is supplied on clamp lead 28. This signal on lead 28 operates to establish the state of the flip-flop in the output of phase detector 26. This action reduces the magnitude of the average value of the output signal appearing on lead 30 and, thus, reduces the phase rate of (and frequency offset) change of the signal being supplied by oscillator 38.

By observing FIG. 4, it will be noted that it is assumed that conditions are balanced at the beginning so that the pulse on line 18 is mid-way between the pulses on line 10. Although the action in FIG. 4 had to be compressed into an unreasonably short number of pulses for illustrative purposes, it is believed that the action is clear. As illustrated, the third pulse on line 10 of FIG. 4 has occurred much sooner than normal. This produces a nonsymmetrical waveform on lead 30 and the circuit attempts to correct the timing of the pulses on line 18 by changing the frequency of oscillator 38. As will be observed, the filtered average of the waveform 30 provides an output shown as waveform 34. When this value gets to be too great, the positive detection circuit 104 provides an output which is passed through NOR gate 70 to deactivate gate 74 and thus prevent the positive set side 66 of the output flip-flop in phase detector 26 from operating until the magnitude of the error signal on lead 30 is again within prescribed limits. This is illustrated by the dashed line shown in waveform 10 at the fourth pulse (the dashed line pulse is removed from affecting the output by the circuitry discussed supra). As designed, this operation occurs only when enable auto switch line 46 is a logic "1" thereby disabling the frequency detection function. Since the waveform 30 stays negative until a later pulse (shown as the next pulse) on waveform 10, this significantly decreases the average magnitude of the alternating waveform 30 and, thus, decreases the magnitude of the signal on lead 34. The output on lead 34 again starts increasing after said "later" pulse and, by the time of the seventh illustrated pulse on waveform 10, the amplitude of the signal on lead 34 is again greater than that allowed by the detection circuit 104 and, again, a pulse is eliminated from the flip-flop so as to again keep the output signal on lead 30 at a negative value, thereby again reducing the output signal on lead 34. This triangular waveform action will continue as shown in waveform 30 until the pulses on lead 18 are nearly centered between the pulses on waveform 10, thereby indicating that the pulse lock loop is nearly back in a locked condition and the slew rate has slowed down to less than the capability of the following circuit to handle.

From a reading of the specification so far, it will be realized that while most prior art phase lock loops have as a design objective the instantaneous correction of an internal signal to be phase locked with an applied signal, the present invention has entirely different objectives. These objectives are to prevent the internal signal from approaching phase lock with an external applied signal at a rate faster than some given maximum. Thus, a clamping or limiting signal is used to keep the phase rate of change (or the dynamic response of the loop) from exceeding a predetermined value. Although this temporary action may be accomplished by lowering the bandwidth of the loop, such a modification is not economically feasible on a commercial product. If the bandwidth is permanently lowered to obtain such a response, the normal operation lock time increases inordinately.

In view of the fact that various implementations of this concept will be obvious to one skilled in the art and will be applicable to not only phase detectors, but also to frequency detectors, I wish to be limited only by the scope of the appended claims.

I claim:

1. Phase lock loop apparatus comprising, in combination:
   phase detection means including first and second input signal means, control input means and control signal output means;
   signal controlled variable frequency signal generating means connected between said control signal output means and said first input signal means of said phase detection means; and
   third means connected between said control signal output means and said control input means of said phase detection means for limiting the control signals appearing at said control signal output means to within a predetermined set of boundaries through the use of a feedback control signal applied to said control input means.

2. Apparatus as claimed in claim 1 wherein said phase detection means comprises, in combination:
   phase detector means of the type that is switched from one state to the other upon each occurrence of an input pulse at said first and second input means, whereby a substantially symmetrical output square wave is obtained when a signal having first characteristics appears at said first input signal means midway between two signal pulses of the same characteristics appearing at said second input signal means; and
   filter means for averaging the voltage excursions of the square wave signal obtained from said phase detector, the averaged signal being supplied as the control signal at said control signal output means.

3. Apparatus as claimed in claim 2 wherein said third means comprises, in combination:
   signal magnitude detection means for detecting the magnitude of said control signal received from said phase detection means relative to said predetermined set of boundaries; and
   signal amplitude detection means for preventing switching operation of said phase detector from a time immediately subsequent to the time at which said control signal exceeds said predetermined set of boundaries until it is returned to within said set of boundaries.

4. Phase lock loop apparatus comprising, in combination:
   phase detection means including first and second input signal means, control input means and control signal output means, for providing an output signal which varies in amplitude in accordance with the relative time of occurrence of signals of a given characteristic being applied at said first and said second input signal means;
   signal controlled variable frequency signal generating means connected between said control signal output means and said first input signal means of said phase detection means; and
   third means connected between said control signal output means and said control input means of said phase detection means for limiting the frequency offset of the signal generated by said signal controlled variable frequency signal generating means to less than a predetermined value through the use of a feedback signal applied to said control input means.

5. Control apparatus comprising, in combination:
digital data signal lock loop means, including signal input means, for internally generating a first signal which is driven toward phase lock with respect to a second signal applied to said signal input means whenever said second signal changes a given characteristic with respect to the same characteristic of the first signal; and
limiting means, connected to said signal lock loop means outside the signal flow path from input to output of said signal lock means, for allowing said first signal to continue being driven toward phase lock while preventing the rate of change of said first signal from exceeding a chosen value.

6. Control apparatus comprising, in combination:
signal lock loop means, including signal input means, for internally generating a first signal which is driven toward phase lock with respect to a second signal applied to said signal input means whenever said second signal changes a given characteristic with respect to the same characteristic of the first signal; and
limiting means, connected to said signal lock loop means outside the signal flow path from input to output of said signal lock means, for continuing the drive of said first signal toward phase lock while restricting the dynamic response of the signal lock loop means to less than a given maximum value.

* * * * *

UNITED STATES PATENT AND TRADEMARK OFFICE
CERTIFICATE OF CORRECTION

PATENT NO. : 4,166,984
DATED : September 4, 1979
INVENTOR(S) : James R. Jenkins

It is certified that error appears in the above-identified patent and that said Letters Patent are hereby corrected as shown below:

Column 4, line 19, after "deactivate" insert --NOR--;

line 43, delete "pulse" and substitute therefor --phase--.

IN THE CLAIMS

Column 6, line 16, after "feedback" insert --control--.

Signed and Sealed this

Twentieth Day of November 1979

[SEAL]

Attest:

RUTH C. MASON
Attesting Officer

LUTRELLE F. PARKER
Acting Commissioner of Patents and Trademarks